US012603262B2

(12) United States Patent
Nakano et al.

(10) Patent No.: US 12,603,262 B2
(45) Date of Patent: Apr. 14, 2026

(54) CLEANING METHOD AND PLASMA PROCESSING APPARATUS

(71) Applicant: Tokyo Electron Limited, Tokyo (JP)

(72) Inventors: Yoshiki Nakano, Nirasaki (JP); Takafumi Nogami, Nirasaki (JP); Kenichi Kote, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 274 days.

(21) Appl. No.: 18/552,292

(22) PCT Filed: Mar. 14, 2022

(86) PCT No.: PCT/JP2022/011196
§ 371 (c)(1),
(2) Date: Sep. 25, 2023

(87) PCT Pub. No.: WO2022/202428
PCT Pub. Date: Sep. 29, 2022

(65) Prior Publication Data
US 2024/0170267 A1 May 23, 2024

(30) Foreign Application Priority Data
Mar. 26, 2021 (JP) ................................. 2021-054055

(51) Int. Cl.
*H01J 37/32* (2006.01)
*C23C 16/44* (2006.01)
(52) U.S. Cl.
CPC .... *H01J 37/32862* (2013.01); *C23C 16/4405* (2013.01); *H01J 37/32192* (2013.01)

(58) Field of Classification Search
None
See application file for complete search history.

(56) References Cited

U.S. PATENT DOCUMENTS

2009/0117270 A1* 5/2009 Yamasaki ............... C23C 16/16
427/248.1

FOREIGN PATENT DOCUMENTS

| JP | 2007084908 A | 4/2007 |
| JP | 2008211099 A | 9/2008 |
| JP | 2019216150 A | 12/2019 |
| JP | 2021034515 A | 3/2021 |
| KR | 10-2018-0135024 A | 12/2018 |
| WO | 2017199570 A1 | 11/2017 |

* cited by examiner

*Primary Examiner* — Kaj K Olsen
*Assistant Examiner* — Arlyn I Rivera-Cordero
(74) *Attorney, Agent, or Firm* — Armstrong Teasdale LLP

(57) ABSTRACT

In a specification step, the pressure within a processing container at the time of plasma cleaning is specified from the amount of damage to a protective film that is provided on an inner surface of the processing container and the cleaning rate at which accumulated matter that accumulates in the processing container is removed, said amount of damage and said cleaning rate being treated as plasma cleaning parameters. In a cleaning step, the pressure within the processing container is adjusted to the pressure that was specified in the specification step, while a cleaning gas is supplied into the processing container, and microwaves are used to generate plasma within the processing container and plasma cleaning is performed within the processing container.

18 Claims, 7 Drawing Sheets

FIG. 1

CLEANING METHOD AND PLASMA PROCESSING APPARATUS

CROSS-REFERENCE TO RELATED APPLICATIONS

The present application is a U.S. National Stage Entry of International Patent Application No. PCT/JP2022/011196, filed Mar. 14, 2022, which claims the benefit of priority to Japanese Patent Application No. 2021-054055, filed Mar. 26, 2021, each of which is hereby incorporated herein by reference in its entirety.

TECHNICAL FIELD

The present disclosure relates to a cleaning method and a plasma processing apparatus.

BACKGROUND

Patent Document 1 proposes a technique in which the interior of a processing container is cleaned at a first pressure and a second pressure higher than the first pressure when the cleaning is performed by generating plasma while supplying a cleaning gas into the processing container.

PRIOR ART DOCUMENTS

Patent Documents

Patent Document 1: Japanese Patent Laid-Open Publication No. 2008-211099

The present disclosure provides a technique that suppresses damage to the interior of a processing container due to plasma cleaning and improves productivity.

SUMMARY

A cleaning method according to an aspect of the present disclosure includes a specifying process and a cleaning process. In the specifying process, the pressure within a processing container during plasma cleaning is specified from the amount of damage to a protective film provided on the inner surface of the processing container and the cleaning rate at which a deposit deposited in the processing container is removed, wherein the amount of damage and the cleaning rate are conditions for plasma cleaning. In the cleaning process, the pressure within the processing container is adjusted to the pressure specified in the specifying process while supplying a cleaning gas into the processing container, plasma is generated in the processing container by microwaves, and the interior of the processing container is cleaned with the plasma.

According to the present disclosure, it is possible to suppress damage to the interior of a processing container due to plasma cleaning and to improve productivity.

BRIEF DESCRIPTION OF DRAWINGS

FIG. 1 is a cross-sectional view schematically illustrating an example of a plasma processing apparatus according to an embodiment.

FIGS. 3A and 3B are views illustrating an example in which a protective film of a processing chamber according to the embodiment is etched by plasma for a plasma cleaning.

DETAILED DESCRIPTION

Figure 2:
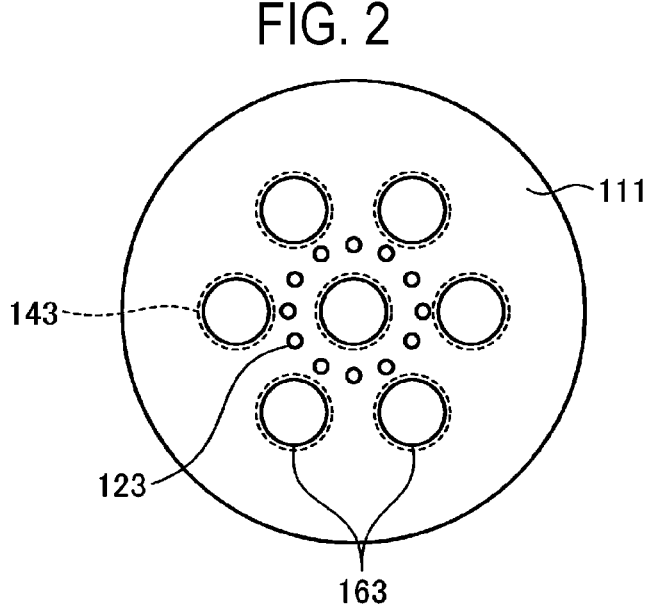
FIG. 2 is a view illustrating an example of an arrangement of antenna modules on a ceiling wall according to an embodiment.

Hereinafter, embodiments of a cleaning method and a plasma processing apparatus disclosed herein will be described in detail with reference to the drawings. The disclosed cleaning method and plasma processing apparatus are not limited by the embodiments.

In recent years, with the increasing density and miniaturization of semiconductor products, a plasma processing apparatus using microwaves for film formation is used in a semiconductor product manufacturing process. The plasma processing apparatus may generate plasma stably even in a high-vacuum state having a relatively low pressure by using microwaves. In addition, the plasma processing apparatus may generate high-density plasma by using microwaves. In the plasma processing apparatus, when film formation is performed, deposits are deposited on the surfaces of the structures within the processing container, such as the inner wall surface within the processing container. Therefore, in the plasma processing apparatus, a plasma cleaning is performed to remove deposits by causing a cleaning gas to flow into the processing chamber each time a film formation is performed on a predetermined number of substrates or each time a film formation is performed to a predetermined cumulative film thickness. For example, in Patent Document 1, a plasma cleaning is performed by switching the pressure within the processing container between two states of a first pressure and a second pressure higher than the first pressure.

It is known that a plasma processing apparatus is provided with a protective film on the inner surface of the processing container thereof in order to protect the inner surface of the processing container from plasma damage. In the processing container provided with a protective film, for example, in the cleaning such as that disclosed in Patent Document 1, in particular, plasma cleaning damage by the first pressure (low pressure) is great, and the frequency of maintenance, such as replacement of components, increases. Increased frequency of maintenance has a great effect on productivity. Therefore, there is a need for a technique for suppressing damage to the interior of the processing container due to plasma cleaning and improving productivity.

EMBODIMENTS

Figure 1:
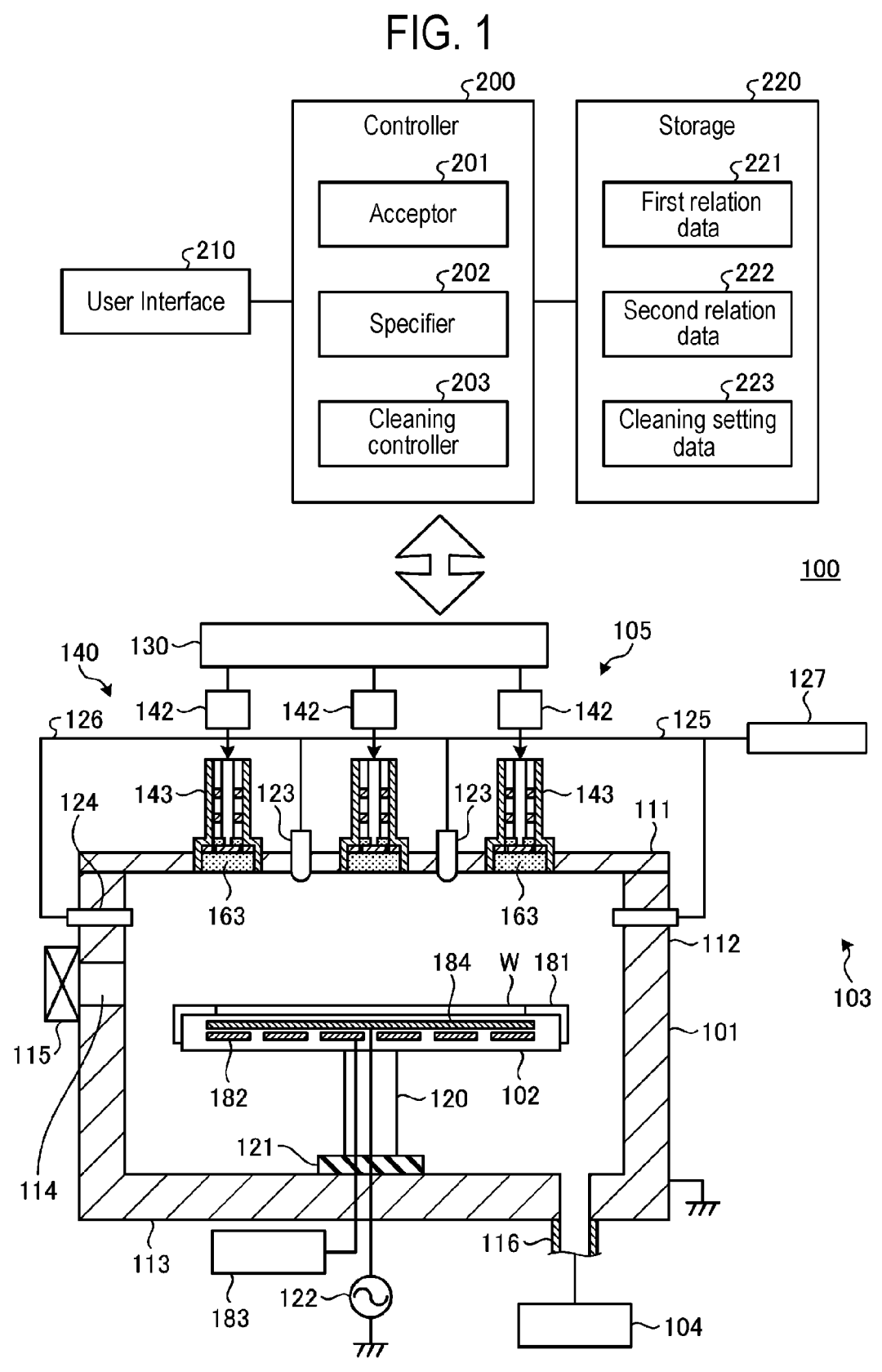

An embodiment will be described. First, an example of a plasma processing apparatus for executing a cleaning method of the present disclosure will be described. FIG. 1 is a cross-sectional view schematically illustrating an example of a plasma processing apparatus 100 according to an embodiment. The plasma processing apparatus 100 illustrated in FIG. 1 includes a processing container 101, a stage 102, a gas supply mechanism 103, an exhaust mechanism 104, a microwave plasma source 105, and a controller 200.

The processing container 101 accommodates a substrate W such as a semiconductor wafer. The processing container 101 is provided with a stage 102 therein. A substrate W is placed on the stage 102. The gas supply mechanism 103 supplies gas into the processing container 101. The interior of the processing container 101 is exhausted by the exhaust mechanism 104. The microwave plasma source 105 generates microwaves for generating plasma in the processing container 101 and introduces the microwaves into the processing container 101. The controller 200 controls the operation of each part of the plasma processing apparatus 100.

The processing container 101 is formed of, for example, a metal material, such as aluminum or an alloy thereof, and has a substantially cylindrical shape. The processing container 101 includes a plate-shaped ceiling wall 111, a bottom wall 113, and a side wall portion 112 connecting the ceiling wall 111 and the bottom wall 113 to each other. The inner wall of the processing container 101 may be provided with a protective film by being coated with yttria ($Y_2O_3$) or the like. The microwave plasma source 105 is provided above the processing container 101 and introduces electromagnetic waves (microwaves) into the processing container 101 to generate plasma. The microwave plasma source 105 will be described in detail later.

The ceiling wall 111 includes a plurality of openings into which microwave radiation mechanisms 143 and gas introduction nozzles 123 (to be described later) of the microwave plasma source 105 are fitted. The side wall portion 112 has a carry-in/out port 114 for performing carry-in/out of a substrate W to/from a transport chamber (not illustrated) adjacent to the processing container 101. In addition, the side wall portion 112 is provided with gas introduction nozzles 124 at positions above the stage 102. The carry-in/out port 114 is opened/closed by a gate valve 115.

An opening is provided in the bottom wall 113, and an exhaust mechanism 104 is provided via an exhaust pipe 116 connected to the opening. The exhaust mechanism 104 includes a vacuum pump and a pressure control valve. By the vacuum pump of the exhaust mechanism 104, the interior of the processing container 101 is exhausted through the exhaust pipe 116. The pressure within the processing container 101 is controlled by the pressure control valve of the exhaust mechanism 104.

The stage 102 has a disk shape. The stage 102 is made of a metal material, such as aluminum having an anodized surface, or a ceramic material, such as aluminum nitride (AlN). A substrate W is placed on the top surface of the stage 102. The stage 102 is supported by a cylindrical support member 120 made of ceramic, such as AlN, and extending upward from the center of the bottom of the processing container 101 and a base member 121. A guide ring 181 configured to guide the substrate W is provided on the outer edge of the stage 102. Inside the stage 102, lifting pins (not illustrated) configured to raise and lower the substrate W are provided to be capable of protruding and retracting with respect to the top surface of the stage 102.

Furthermore, the stage 102 has a resistance heating-type heater 182 embedded therein. The heater 182 heats the substrate W placed on the stage 102 by being fed with power from a heater power supply 183. A thermocouple (not illustrated) is inserted into the stage 102 so that the heating temperature of the substrate W can be controlled based on a signal from the thermocouple. In addition, the stage 102 includes an electrode 184 having the same size as the substrate W and embedded above the heater 182. A radio-frequency bias power supply 122 is electrically connected to the electrode 184. The radio-frequency bias power supply 122 applies radio-frequency bias for attracting ions to the stage 102. The radio-frequency bias power supply 122 may not be provided depending on a plasma processing characteristic.

The gas supply mechanism 103 supplies various processing gases into the processing container 101. The gas supply mechanism 103 includes gas introduction nozzles 123 and 124, gas supply pipes 125 and 126, and a gas supplier 127. The gas introduction nozzles 123 are fitted into respective openings formed in the ceiling wall 111 of the processing container 101. The gas introduction nozzles 124 are fitted into respective openings formed in the side wall portion 112 of the processing container 101. The gas supplier 127 is connected to each gas introduction nozzle 123 via the gas supply pipe 125. In addition, the gas supplier 127 is connected to respective gas introduction nozzles 124 via the gas supply pipes 126. The gas supplier 127 includes various gas sources. In addition, the gas supplier 127 is provided with an opening/closing valve for performing starting and stopping the supply of various gases and a flow rate adjuster configured to adjust the flow rate of a gas. For example, when performing a film formation, the gas supplier 127 supplies a processing gas containing a film forming material. In addition, when performing a plasma cleaning, the gas supplier 127 supplies a cleaning gas.

The microwave plasma source 105 is provided in an upper portion of the processing container 101. The microwave introduction device microwave plasma source 105 introduces electromagnetic waves (microwaves) into the processing container 101 to generate plasma.

The microwave plasma source 105 includes the ceiling wall 111 of the processing container 101, a microwave output part 130, and an antenna unit 140. The ceiling wall 111 functions as a ceiling plate of the processing container 101. The microwave output part 130 generates microwaves and distributes and outputs the microwaves to a plurality of paths. The antenna unit 140 introduces the microwaves output from the microwave output part 130 into the processing container 101.

The microwave output part 130 includes a microwave power supply, a microwave oscillator, an amplifier, and a distributor. The microwave oscillator is solid state and oscillates microwaves at, for example, 860 MHz (e.g., PLL oscillation). The frequency of microwaves is not limited to 860 MHz, and a frequency in the range of 700 MHz to 10 GHz, such as 2.45 GHz, 8.35 GHz, 5.8 GHz, or 1.98 GHz, may be used. The amplifier amplifies the microwaves oscillated by the microwave oscillator. The distributor distributes the microwaves amplified by the amplifier to a plurality of paths. The distributor distributes microwaves while matching the impedance on the input and output sides.

The antenna unit 140 includes a plurality of antenna modules. FIG. 1 illustrates three antenna modules of the antenna unit 140. Each antenna module includes an amplifier 142 and a microwave radiation mechanism 143. The microwave output part 130 generates microwaves, and distributes and outputs the microwaves to each antenna module. The amplifier 142 of the antenna module mainly amplifies the distributed microwaves and outputs the amplified microwaves to the microwave radiation mechanism 143. The microwave radiation mechanism 143 is provided on the ceiling wall 111. The microwave radiation mechanism 143 radiates the microwaves output from the amplifier 142 into the processing container 101.

The amplifier 142 includes a phase shifter, a variable gain amplifier, a main amplifier, and an isolator. The phase shifter changes the phase of the microwaves. The variable gain amplifier adjusts the power level of the microwaves input to the main amplifier. The main amplifier is configured as a solid state amplifier. The isolator separates reflected microwaves that are reflected by the antennas of the microwave radiation mechanisms 143 (to be described later) and headed toward the main amplifier.

As illustrated in FIG. 1, a plurality of microwave radiation mechanisms 143 are provided on the ceiling wall 111. In addition, the microwave radiation mechanisms 143 each have a cylindrical outer conductor and an inner conductor provided coaxially with the outer conductor within the outer conductor. In addition, the microwave radiation mechanisms 143 each have a coaxial tube having a microwave transmission path between the outer conductor and the inner conductor, and an antenna that radiates microwaves into the processing container 101. On the bottom surface side of the antenna unit, a microwave transmission plate 163 fitted into the ceiling wall 111 is provided. The bottom surface of the microwave transmission plate 163 is exposed to the inner space of the processing container 101. The microwaves transmitted through the microwave transmitting plate 163 generate plasma in the space within the processing container 101.

FIG. 2 is a view illustrating an example of an arrangement of antenna modules in a ceiling wall 111 according to an embodiment. As illustrated in FIG. 2, seven microwave radiation mechanisms 143 of the antenna module are provided on the ceiling wall 111. The microwave radiation mechanisms 143 are arranged so that six of them are vertices of a regular hexagon, and one is arranged at the center of the regular hexagon. In addition, on the ceiling wall 111, microwave transmission plates 163 are disposed corresponding to the seven microwave radiation mechanisms 143, respectively. These seven microwave transmission plates 163 are arranged such that adjacent microwave transmission plates 163 are equally spaced apart from each other. In addition, the plurality of gas introduction nozzles 123 of the gas supply mechanism 103 are arranged to surround the periphery of the central microwave transmission plate. In addition, the number of antenna modules provided in the ceiling wall 111 is not limited to seven.

The antenna unit 140 according to the embodiment is configured to be capable of adjusting the power of microwave plasma radiated from the microwave radiation mechanism 143 of each antenna module by controlling the amplifier 142 of each antenna module. The antenna unit 140 is configured to be capable of controlling the power ratio of microwave plasma radiated from the microwave radiation mechanisms 143 between the central portion and the peripheral portion. For example, the antenna unit 140 is capable of controlling the power ratio of microwaves between the central portion and the peripheral portion to be in the range of 0:550 to 500:550.

As long as a microwave power density can be appropriately controlled, a microwave plasma source having a single microwave introduction part having a size corresponding to a substrate W may be used.

The operation of plasma processing apparatus 100 configured as described above is comprehensively controlled by the controller 200. A user interface 210 and a storage 220 are connected to the controller 200.

The user interface 210 may be configured as an operation part, such as a keyboard, on which a process manager inputs commands to manage the plasma processing apparatus 100, or a display part, such as a display that visualizes and displays the operating state of the plasma processing apparatus 100. The user interface 210 accepts various operations. For example, the user interface 210 accepts a predetermined operation instructing the start of plasma processing.

The storage 220 is a storage device that stores various types of data. For example, the storage 220 is a storage device such as a hard disk, a solid state drive (SSD), or an optical disk. The storage 220 may be a semiconductor memory that is capable of rewriting data, such as a random access memory (RAM), a flash memory, or a nonvolatile static random access memory (NVSRAM).

The storage 220 stores an operating system (OS) and various recipes executed by the controller 200. For example, the storage 220 stores various recipes including recipes for executing each process of a cleaning method to be described later. In addition, the storage 220 stores various data to be used in recipes. For example, the storage 220 stores first relation data 221, second relation data 222, and cleaning setting data 223. Details of the first relation data 221 and the second relation data 222 will be described later. The cleaning setting data 223 is data storing various settings for plasma cleaning. In addition, the programs or the data may be used in the state of being stored in a computer-readable computer storage medium (e.g., a hard disk, a CD, a flexible disk, or a semiconductor memory). Alternatively, the programs or data may be transmitted from another device at any time via, for example, a dedicated line to be used online.

The controller 200 is a device that controls the plasma processing apparatus 100. As the controller 200, an electronic circuit, such as a central processing unit (CPU) or a micro-processing unit (MPU), or an integrated circuit, such as an application-specific integrated circuit (ASIC) or a field programmable gate array (FPGA), may be adopted. The controller 200 has an internal memory for storing programs and control data that define various processing procedures, and executes various processes using these programs or data. The controller 200 serves as various processors by executing various programs. For example, the controller 200 includes an acceptor 201, a specifier 202, and a cleaning controller 203.

The controller 200 controls each part of the plasma processing apparatus 100. For example, the controller 200 controls each part of the plasma processing apparatus 100 to perform film formation according to the recipe of recipe data stored in the storage 220. In the plasma processing apparatus 100, a substrate W is placed on the stage 102. The plasma processing apparatus 100 performs film formation on the substrate W placed on the stage 102. For example, the plasma processing apparatus 100 applies bias power to the stage 102 from the radio-frequency bias power supply 122. In addition, the plasma processing apparatus 100 forms a silicon-containing film on the substrate W by generating plasma by introducing microwaves into the processing container 101 from the microwave plasma source 105 while suppling a processing gas containing, for example, a silicon-containing gas and a nitrogen-containing gas from the gas supplier 127 into the processing chamber 101.

Examples of the silicon-containing gas include a silane-based hydrogen gas or a silane-based halogen gas, such as $SiH_4$, $Si_2H_6$, or $SiH_2Cl_4$. Examples of the nitrogen-containing gas include a hydrogen nitride-based gas, such as $NH_3$, $N_2H_2$, or $N_3H_5$, such as ammonia, hydrazine, or triazane, and nitrogen gas $N_2$ alone. In addition, the gas supplier 127 may further supply another gas, such as a rare gas or a carbon-containing gas, as a processing gas.

In the present embodiment, a SiN film is formed on the substrate W as a silicon-containing film by using, for example, $SiH_4$ gas as the silicon-containing gas and $NH_3$ gas as the nitrogen-containing gas.

The controller 200 controls the power of microwave plasma radiated from the microwave radiation mechanism 143 of each antenna module by controlling the amplifier 142 of each antenna module during film formation. For example, the controller 200 controls the power ratio of microwaves between the central portion of the upper portion of the processing chamber 101 and the peripheral portion surrounding the central portion to be in the range of 0:550 to 500:550, as needed.

As described above, when the plasma processing apparatus 100 performs film formation, deposits are deposited on the surfaces of the structures within the processing container 101. For example, when a silicon-containing film is formed on a substrate W, the silicon-containing material is deposited as a deposit on the surfaces of the structures within the processing chamber 101. Examples of silicon-containing materials to be deposited include SiN, SiCN, SiON, SiOCN, SiC, and amorphous silicon (a-Si). In addition, as a deposit, amorphous carbon (a-C) may be deposited.

Therefore, the plasma processing apparatus 100 executes plasma cleaning for removing deposits by generating plasma while causing a cleaning gas to flow into the processing chamber 101 each time the film formation is performed on a predetermined number of substrates W or each time the film formation is performed to a predetermined cumulative film thickness. The plasma cleaning is executed by switching the pressure within the processing container 101 between two states during the cleaning, for example, as in the related arts.

When the plasma cleaning is executed, the protective film provided on the inner surface of the processing container 101 is damaged by the plasma for the plasma cleaning. In the plasma processing apparatus 100, when the plasma cleaning is repeatedly executed, the protective film on the inner surface of the processing container 101 is gradually etched by the plasma for the plasma cleaning, and the inner surface of the processing container 101 is exposed.

Figure 3A:
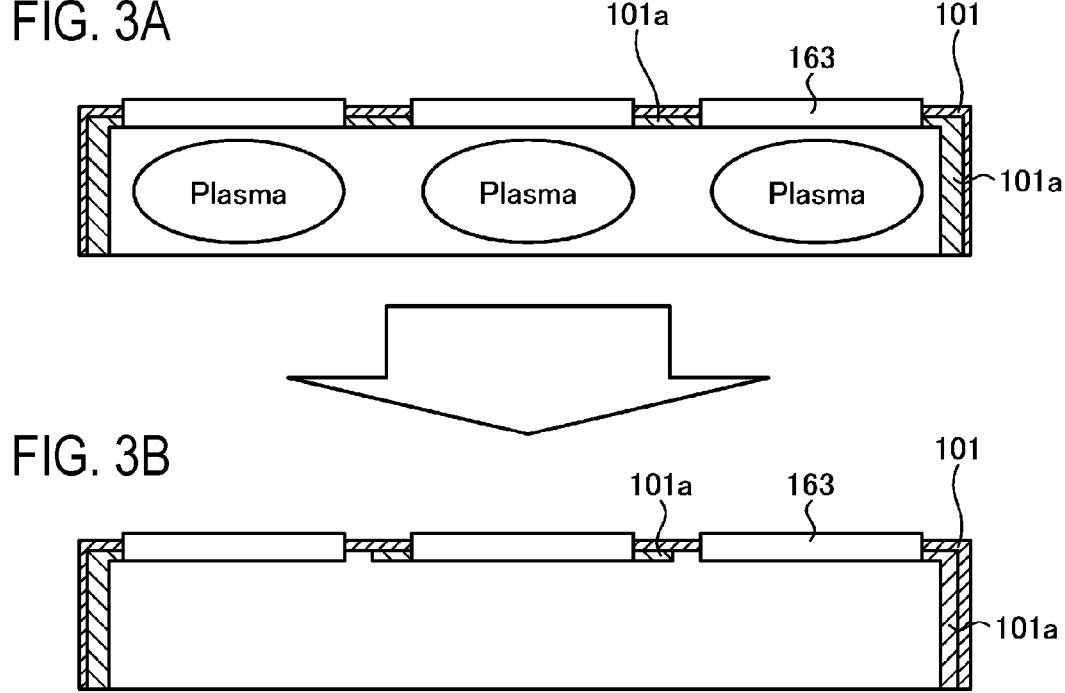

FIGS. 3A and 3B are views illustrating an example in which a protective film of a processing container 101 according to an embodiment is etched by plasma for plasma cleaning. FIG. 3A schematically illustrates an upper portion of the processing container 101 in the initial state. FIG. 3B schematically illustrates an upper portion of the processing container 101 that has been subjected to repeated plasma cleaning. On the ceiling wall 111 of the processing container 101, three microwave transmission plates 163 provided corresponding to the microwave radiation mechanisms 143 are illustrated. A protective film 101a is provided on the inner surface of the processing container 101. The protective film 101a is, for example, an yttria ($Y_2O_3$) film. In the plasma cleaning, plasma is generated in the space within the processing container 101 by microwaves radiated from the microwave radiation mechanisms 143 and transmitted through the microwave transmission plates 163. In the plasma processing apparatus 100, when the plasma cleaning is regularly and repeatedly executed, the protective film 101a on the inner surface of the processing container 101 is etched by plasma and the inner surface of the processing container 101 is exposed. In FIG. 3B, portions of the protective film 101a around the microwave transmission plates 163 are missing, and the inner surface of the processing chamber 101 is partially exposed.

In the plasma cleaning, when the pressure within the processing container 101 during the cleaning is low, the protective film 101a is damaged so much that the protective film 101a is etched and the inner surface of the processing container 101 is exposed. In addition, when the pressure within the processing container 101 during the cleaning is high, the damage to the protective film 101a is small, and the etching of the protective film 101a is suppressed, but the cleaning time is prolonged, adversely affecting productivity.

Figure 4:
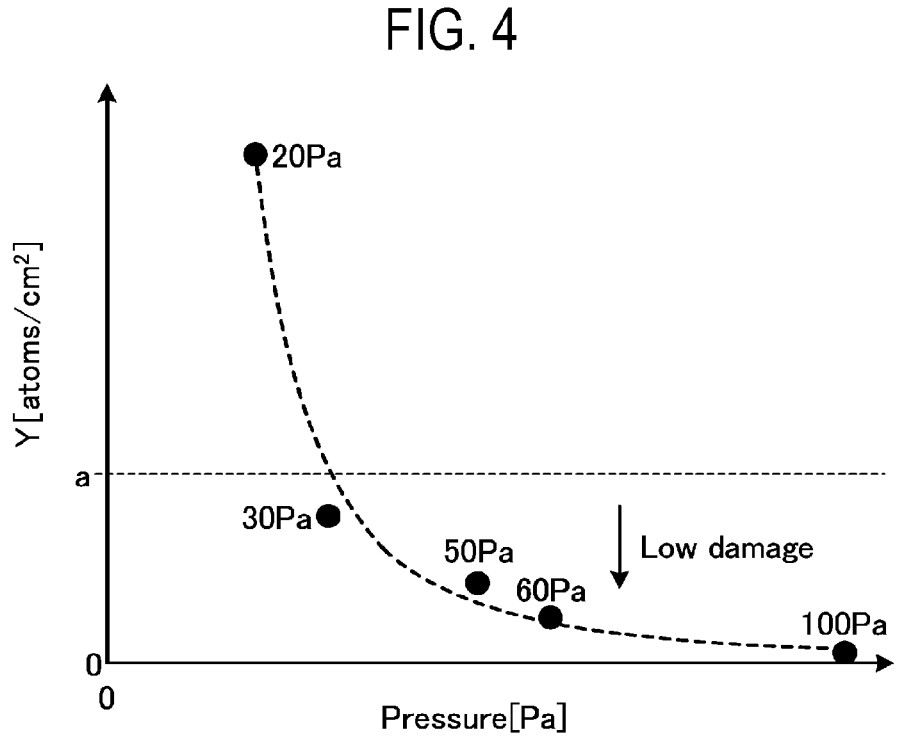
FIG. 4 is a graph showing an example of the relationship between a pressure within a processing container and the amount of damage to a protective film in a plasma cleaning according to an embodiment.

The damage in the processing container 101 and the removal amount (cleaning rate) of deposits accumulated in the processing container 101 will be further described. FIG. 4 is a graph showing an example of the relationship between a pressure within a processing container 101 and the amount of damage to a protective film 101a in the plasma cleaning according to an embodiment. When the protective film 101a is etched, components of the protective film 101a scatter into the processing container 101. The vertical axis of the graph in FIG. 4 represents the amount of damage Y to the protective film 101a, in which the amount of damage Y increases toward the top side. The horizontal axis of the graph represents the pressure within the processing container 101 in the plasma cleaning, and the pressure increases toward the right side. The amount of damage to the protective film 101a is the amount of a component of the protective film deposited on the substrate W, in which the amount was obtained by executing plasma cleaning on the substrate W placed on the top surface of the stage 102 and then taking out the substrate W. In the present embodiment, the area density per unit area of Y (yttrium), which is a component of yttria ($Y_2O_3$) coated as the protective film 101a, is expressed as the amount of damage Y.

As shown in FIG. 4, the amount of damage Y decreases as the pressure in the processing container 101 increases. In addition, the decreasing tendency of the amount of damage Y decreases exponentially up to a certain pressure. That is, when the pressure within the processing container 101 is low, the amount of damage Y is large, and when the pressure within the processing container 101 is high, the amount of damage Y is small.

Figure 5:
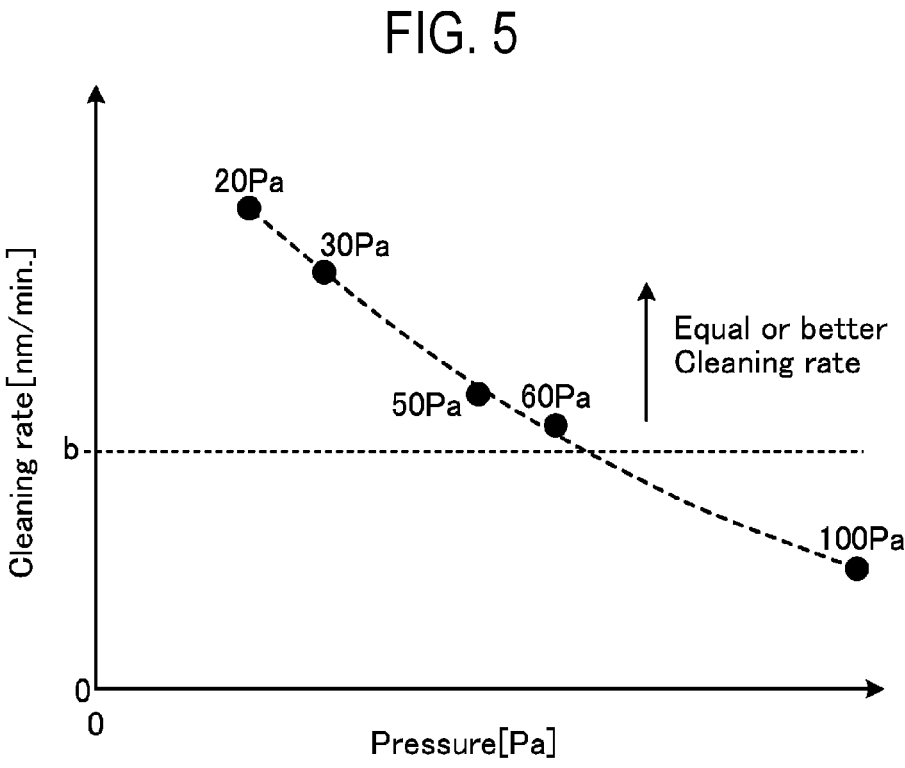
FIG. 5 is a graph showing an example of the relationship between a pressure within a processing container and a cleaning rate in a plasma cleaning according to an embodiment.

FIG. 5 is a graph showing an example of the relationship between a pressure within a processing container 101 and a cleaning rate in plasma cleaning according to an embodiment. The vertical axis of the graph of FIG. 5 represents the cleaning rate of plasma cleaning, and the cleaning rate increases toward the top side. The horizontal axis of the graph represents the pressure within the processing container 101 in the plasma cleaning, and the pressure increases toward the right side. The cleaning rate is an amount of decrease per unit time in the film thickness of deposits within the processing container 101 by the plasma cleaning. In the present embodiment, the cleaning rate was obtained from a change in the spectrum of a specific element after measuring emission spectra by an optical sensor installed in the processing container 101 when removing deposits by the plasma cleaning.

As shown in FIG. 5, the cleaning rate decreases as the pressure within the processing container 101 increases.

Return to FIG. 1. As described above, the storage 220 stores the relationships of the amount of damage, the cleaning rate, and the pressure as first relation data 221 and second relation data 222.

The first relation data 221 is data representing the relationship between the pressure within the processing container 101 and the amount of damage to the protective film 101a in the plasma cleaning. The first relation data 221 may be an expression representing, for example, the correlation between the pressure within the processing container 101 and the amount of damage as shown in FIG. 4. In addition, the first relation data 221 may be table data in which the pressure within the processing container 101 is stored for each amount of damage.

The second relation data 222 is data representing the relationship between the pressure within the processing container 101 and the cleaning rate in plasma cleaning. The second relation data 222 may be an expression representing, for example, the correlation between the pressure within the processing container 101 and the cleaning rate as shown in FIG. 5. In addition, the second relation data 222 may be table data in which the pressure within the processing container 101 is stored for each cleaning rate.

The acceptor 201 displays various operation screens on the user interface 210 and accepts various inputs. For example, the acceptor 201 accepts inputs of the amount of damage to the protective film 101a and the cleaning rate, which are conditions for plasma cleaning. In the present embodiment, the acceptor 201 accepts the inputs of the damage amount and the cleaning rate of the protective film 101a, but is not limited thereto. The amount of damage and the cleaning rate of the protective film 101a as conditions for plasma cleaning may be included in recipe data for plasma cleaning, or may be received from another device.

From the amount of damage to the protective film 101a and the cleaning rate, which are conditions for plasma cleaning, the specifier 202 specifies the pressure within the processing container 101 during the plasma cleaning. For example, from the first relation data 221, the specifier 202 specifies a first pressure range in which the amount of damage equal to or less than the amount of damage as the condition for the plasma cleaning is obtained. In addition, from the second relation data 222, the specifier 202 specifies a second pressure range in which a cleaning rate equal to or higher than the cleaning rate as the condition for the plasma cleaning is obtained. Furthermore, the specifier 202 specifies an overlap range where the specified first pressure range and second pressure range overlap each other.

Figure 6:
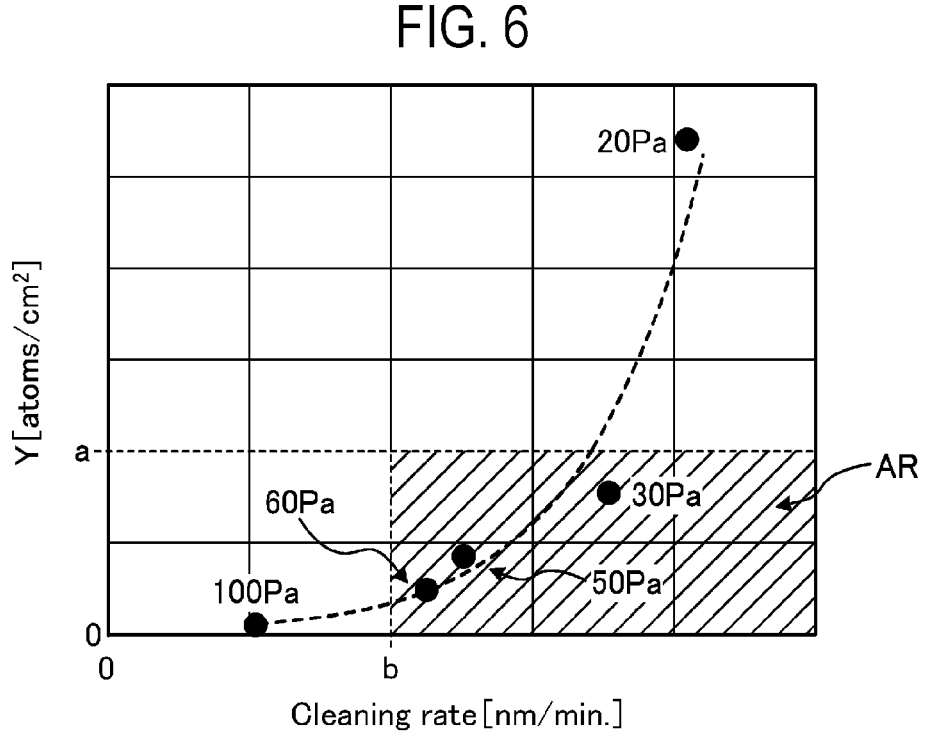
FIG. 6 is a graph showing an example of specifying an overlap range.

FIG. 6 is a graph showing an example of specifying an overlap range. For example, it is assumed that the amount of damage and the cleaning rate of the protective film 101a, which are conditions for plasma cleaning, are "a" indicated in FIG. 4 and "b" indicated in FIG. 5, respectively. The amount of damage a is, for example, $20 \times 10^{12}$ atoms/cm$^2$, and when the amount of damage is a or less, it is possible to suppress the damage to the protective film 101a within the processing container 101. In addition, the cleaning rate b is, for example, 200 nm/min, and when the cleaning rate is b or more, deposits within the processing container can be quickly removed (etched). The specifier 202 specifies, from the first relation data 221, the pressure at which the amount of damage to the protective film 101a is equal to or less than the dashed line a. From the second relation data 222, the specifier 202 also specifies the pressure at which the deposit cleaning rate is equal to or higher than the dashed line b. In addition, as shown in FIG. 6, the specifier 202 specifies, as the overlap range, a pressure in a range AR surrounded by the dashed line a indicating the amount of damage and the dashed line b indicating the cleaning rate from an approximate curve of the pressure obtained from the relationship between the amount of damage and the cleaning rate.

From the specified overlap range, the specifier 202 specifies the pressure within the processing container 101 during plasma cleaning. For example, the specifier 202 specifies the pressure at the center of the overlap range as the pressure within the processing container 101 during plasma cleaning. The specifier 202 may specify any pressure in the overlap range as the pressure within the processing container 101 during plasma cleaning. In addition, when a setting is made to place importance on suppressing the amount of damage to the protective film 101a, the specifier 202 may specify a pressure higher than the center of the overlap range as the pressure within the processing container 101 during the plasma cleaning. For example, the specifier 202 may specify the highest pressure within the overlap range as the pressure within the processing container 101 during the plasma cleaning. Further, when a setting is made to place importance on increasing the cleaning rate, the specifier 202 may specify a pressure lower than the center of the overlap range as the pressure within the processing container 101 during plasma cleaning. For example, the specifier 202 may specify the lowest pressure within the overlap range as the pressure within the processing container 101 during plasma cleaning.

The specifier 202 stores the specified pressure within the processing container 101 during plasma cleaning in cleaning setting data 223 as a set pressure for plasma cleaning.

The cleaning controller 203 executes plasma cleaning within the processing container 101 by adjusting the pressure within the processing container 101 to a pressure specified by the specifier 202 while supplying the cleaning gas into the processing container 101, and generating plasma in the processing container 101 by microwaves. For example, the cleaning controller 203 reads a set pressure for plasma cleaning from the cleaning setting data 223. The cleaning controller 203 controls the exhaust mechanism 104 to adjust the pressure within the processing container 101 to the set pressure for plasma cleaning. The cleaning controller 203 also controls the gas supplier 127 to supply the cleaning gas from the gas supplier 127 into the processing container 101. In addition, the cleaning controller 203 controls the microwave plasma source 105 to radiate microwaves from the microwave plasma source 105 into the processing container 101. As a result, plasma of the cleaning gas is generated in the processing container 101, and plasma cleaning is executed.

The cleaning gas shall contain a halogen-based gas. For example, the cleaning gas contains any of NF$_3$, ClF$_3$, SF$_6$, and CF$_4$. In addition, the cleaning gas may contain an inert gas. For example, the cleaning gas may contain at least one of N$_2$, Ar, and He as an inert gas. The flow rate ratio between the cleaning gas and the inert gas is preferably 10:1 to 10:15.

The cleaning gas may be supplied separately from the gas introduction nozzles 123 and 124. For example, the cleaning controller 203 controls the gas supplier 127 to supply a halogen-based gas from the gas supplier 127 to the gas supply pipe 125 and to supply an inert gas from the gas supplier 127 to the gas supply pipes 126. As a result, the halogen-based gas is supplied into the processing container 101 through the gas supply pipe 125 and from the gas introduction nozzles 123 on the upper portion of the processing container 101. The inert gas is supplied into the processing container 101 through the gas supply pipes 126 and from the gas introduction nozzles 124 on the side surface of the processing container 101. The inert gas may be supplied from the gas supplier 127 to the gas supply pipe 125 and supplied into the processing container 101 from the gas introduction nozzles 123 on the upper portion of the processing container 101. In addition, the halogen-based gas may be supplied from the gas supplier 127 to the gas supply pipes 126 and supplied into the processing container 101 from the gas introduction nozzles 124 on the side surface of the processing container 101.

In addition, during plasma cleaning, the cleaning controller 203 may control the power of the microwave plasma radiated from the microwave radiation mechanism 143 of each antenna module by controlling the amplifier 142 of each antenna module. For example, the controller 200 may control the power ratio of microwaves between the central portion of the upper portion of the processing chamber 101 and the peripheral portion surrounding the central portion to be in the range of 0:550 to 500:550, as needed.

Next, the results of comparing the plasma cleaning of the embodiment in which the pressure within the processing container 101 is within the overlap range specified by the specifier 202, for example, 60 Pa, and the plasma cleaning of a comparative example will be described. In the plasma cleaning of the comparative example, the pressure within the processing container 101 was alternately switched between two states of 20 Pa and 100 Pa.

Figure 7:
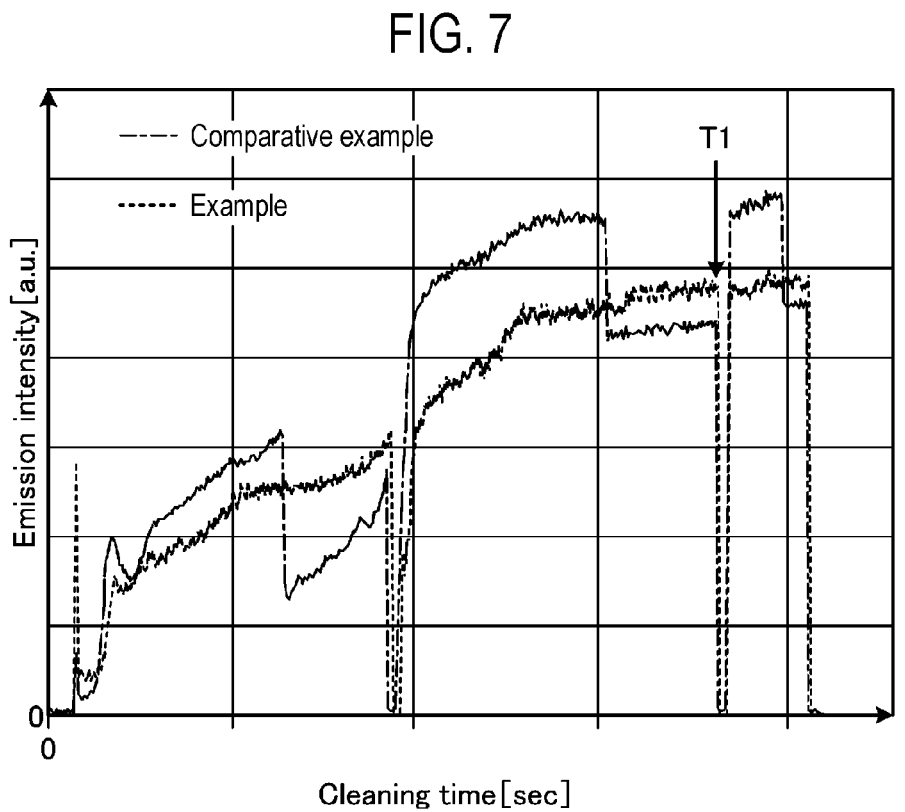
FIG. 7 is a diagram showing an example of a cleaning time of the plasma cleaning according to the embodiment.

FIG. 7 is a diagram showing an example of cleaning time of the plasma cleaning according to the embodiment. FIG. 7 shows the cleaning time in one plasma cleaning process and a change in the emission intensity of plasma during the cleaning. The vertical axis of the graph in FIG. 7 represents the emission intensity of plasma, and the emission intensity increases toward the top side. The horizontal axis of the graph is a cleaning time axis representing the cleaning time. The emission intensity of plasma is obtained by detecting the emission of plasma with an optical sensor. The optical sensor may be disposed within the processing container 101 to detect the emission of plasma. Alternatively, the optical sensor may be disposed outside the processing container 101 and detect emission of plasma through a transparent window provided in the processing container 101. In FIG. 7, a change in the emission intensity of plasma in the plasma cleaning of the embodiment in which the pressure within the processing container 101 was 60 Pa is indicated as "Example". In addition, in FIG. 7, a change in the emission intensity of plasma in the plasma cleaning of the comparative example is indicated as "Comparative Example". In the comparative example, when the pressure within the processing chamber 101 is switched between 20 Pa and 100 Pa, the emission intensity of plasma shifts. In plasma cleaning, fluorine (F) contained in plasma reacts with SiN of deposits to remove the deposits. When there is no deposit within the processing container 101, F is no longer consumed. Therefore, F is saturated, and the emission intensity of plasma is also saturated. In plasma cleaning, the period of time until the emission intensity of plasma is saturated may be regarded as a cleaning time. In view of the fact that the emission intensities of plasma are saturated near the time T1 in both the example and the comparative example, the cleaning times are about the same in the example and the comparative example.

Figure 8:
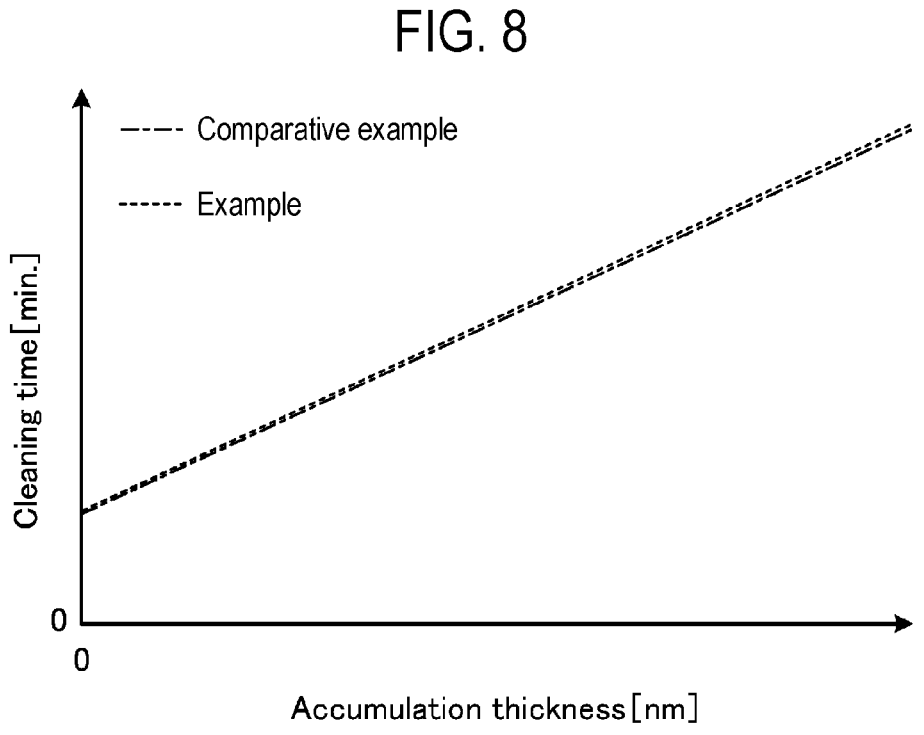
FIG. 8 is a diagram showing examples of a cleaning time and a removed film thickness in a plasma cleaning according to an embodiment.

FIG. 8 is a diagram showing examples of cleaning time and removed film thickness in plasma cleaning according to an embodiment. The vertical axis of the graph in FIG. 8 represents the cleaning time, and the cleaning time increases toward the top side. The horizontal axis of the graph represents the film thickness of deposits removed during the cleaning time, and the film thickness increases toward the right side. In FIG. 8, a change in film thickness of deposits removed when the cleaning time of the plasma cleaning of the embodiment in which the pressure within the processing chamber 101 was 60 Pa was changed is indicated as "Example". In addition, in FIG. 8 a change in film thickness of deposits removed when the cleaning time of the plasma cleaning of the comparative example was changed is indicated as "Comparative Example". The example and the comparative example are similar to each other in the change in film thickness of removed deposits with respect to the cleaning time. The example and the comparative example have similar slopes of change in film thickness, and therefore have similar cleaning rates.

Figure 9:
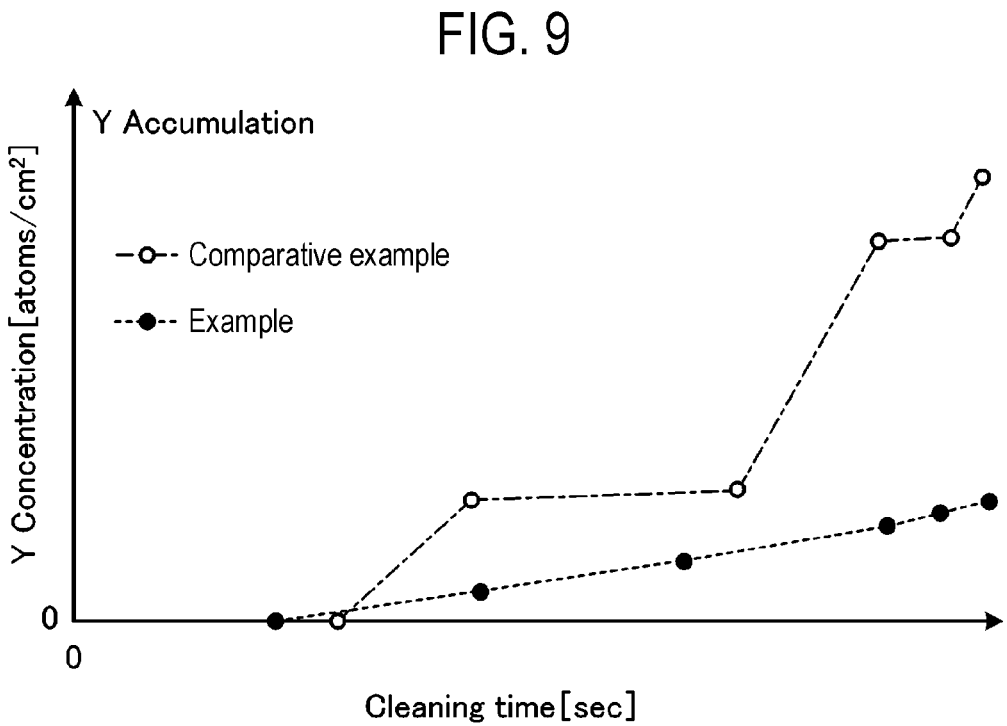
FIG. 9 is a diagram showing an example of a change in the amount of damage to a protective film depending on a cleaning time of a plasma cleaning according to an embodiment.

FIG. 9 is a diagram showing an example of a change in the amount of damage to a protective film 101*a* depending on the cleaning time of plasma cleaning according to an embodiment. The vertical axis of the graph in FIG. 9 represents the cumulative amount of damage Y to a protective film 101*a*, and the amount of damage Y increases toward the top side. The horizontal axis of the graph represents the cleaning time, and the cleaning time increases toward the right side. In FIG. 9, the amount of damage Y of the protective film 101*a* for each cleaning time of the plasma cleaning of the embodiment in which the pressure in the processing container 101 was 60 Pa was plotted, and the line connecting the plotted points is indicated as "Example". In FIG. 9, the amount of damage Y of the protective film 101*a* for each cleaning time of the plasma cleaning of the comparative example was plotted, and a line connecting the plotted points is indicated as "comparative example". The amount of damage to the protective film 101*a* was obtained by performing plasma cleaning in the state in which a substrate W was placed on the top surface of the stage 102, taking out the substrate W at each cleaning time of the plasma cleaning, and calculating the amount of the protective film component adhered to the substrate W. In the example, the amount of damage Y to the protective film 101*a* was smaller than that in the comparative example at any cleaning time, and the damage to the protective film 101*a* was suppressed in the example.

Next, a change in damage to a protective film 101*a* when the plasma processing apparatus 100 periodically executes plasma cleaning will be described.

Figure 10:
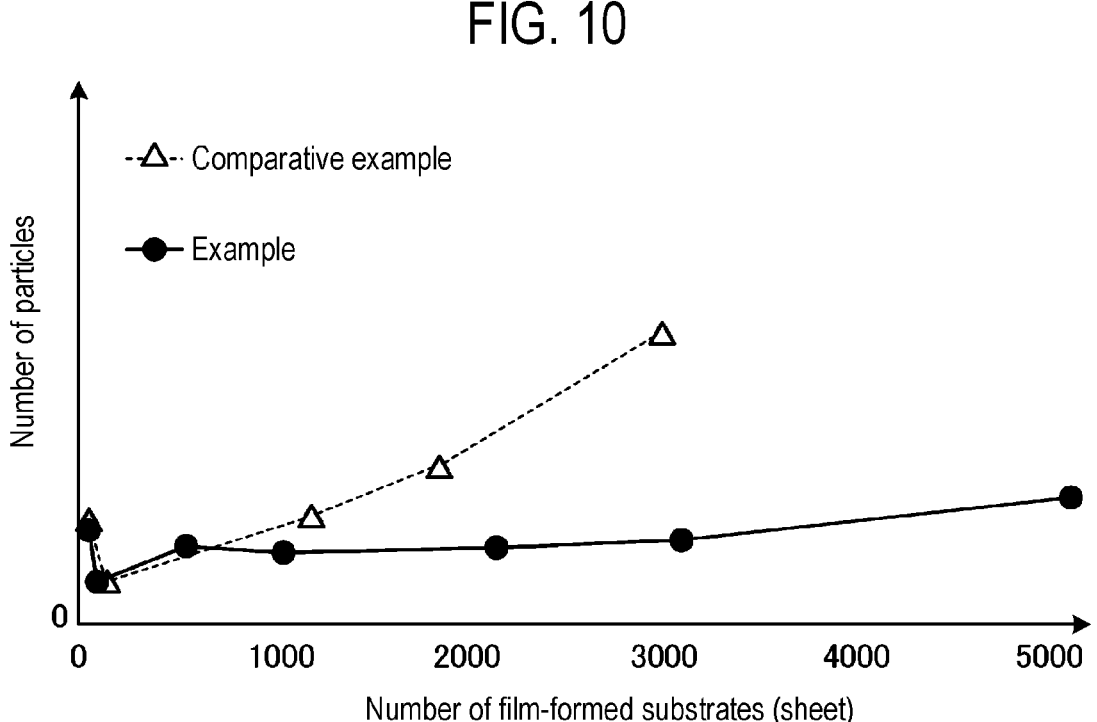
FIG. 10 is a diagram showing an example of a change in the number of particles depending on the number of film-formed substrates according to an embodiment.

FIG. 10 is a diagram showing an example of a change in the number of particles depending on the number of film-formed substrates W according to an embodiment. The vertical axis of the graph in FIG. 10 represents the number of particles adhered to the substrates W, and indicates that the number of particles increases toward the top side. The horizontal axis of the graph represents the number of substrates W subjected to film formation (the number of film-formed substrates). In FIG. 10, the numbers of particles adhered to substrates W when the plasma cleaning of the embodiment in which the pressure within the processing container 101 was 60 Pa was periodically executed were plotted, and the line connecting the plotted points is indicated as "Example". In FIG. 10, the numbers of particles adhered to substrates W when the plasma cleaning of the comparative example was periodically performed were plotted, and a line connecting the plotted points is indicated as "Comparative Example". In the plasma processing apparatus 100, when the protective film 101*a* of the processing container 101 is damaged and worn out, and the inner surface of the processing container 101 is exposed, the numbers of particles adhered to the substrates W increase. In the comparative example, as the number of film-formed substrates W increases, the number of particles increases. Thus, it can be estimated that the damage to the protective film 101*a* gradually increases due to repeated plasma cleaning. On the other hand, in the example, an increase in the number of particles is suppressed compared with the comparative example. Thus, it can be estimated that damage to the protective film 101*a* is suppressed even if the plasma cleaning is repeated. For the plasma processing apparatus 100, it is necessary to perform maintenance such as replacement of components before the number of particles adhered to the substrates W exceeds a predetermined allowable value. Compared with the comparative example, the example is capable of suppressing an increase in the number of particles even if the number of substrates W increases. Therefore, it is possible to increase the number of film-formed substrates W to be processed before the maintenance so that productivity can be improved.

Figure 11:
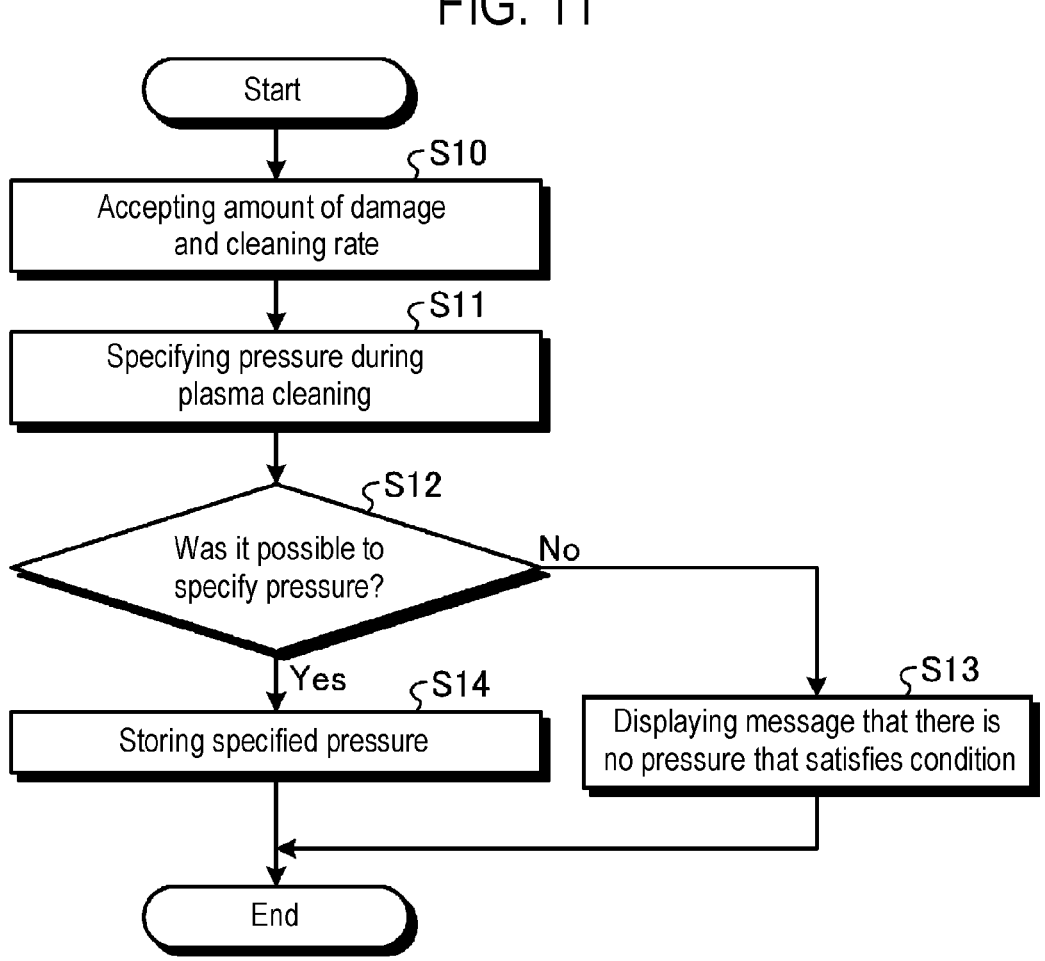
FIG. 11 is a flowchart illustrating an example of a flow of a pressure setting process according to an embodiment.

Next, processing executed by the plasma processing apparatus 100, including processing in each process of the cleaning method according to the embodiment, will be described. First, a flow of pressure setting process for setting a pressure for plasma cleaning will be described. FIG. 11 is a flowchart illustrating an example of a flow of pressure setting process according to an embodiment.

For example, the acceptor 201 causes the user interface 210 to display an operation screen, and accepts inputs of the amount of damage to the protective film 101*a* and the cleaning rate, which are conditions for plasma cleaning (S10). Without being limited to this, as described above, the amount of damage to the protective film 101*a* and the cleaning rate, which are the plasma cleaning conditions, may be included in recipe data for plasma cleaning, and may be received from other apparatuses.

From the amount of damage to the protective film 101*a* and the cleaning rate, which are conditions for plasma cleaning, the specifier 202 specifies the pressure within the processing container 101 during plasma cleaning (S11). For example, from the first relation data 221, the specifier 202 specifies the first pressure range in which the amount of damage equal to or less than the amount of damage as a condition for plasma cleaning is obtained. In addition, from the second relation data 222, the specifier 202 specifies the second pressure range in which a cleaning rate equal to or higher than the cleaning rate as a condition for plasma cleaning is obtained. The specifier 202 specifies an overlap range where the specified first pressure range and second pressure range overlap each other. From the specified overlap range, the specifier 202 specifies the pressure within the processing container 101 during plasma cleaning. For example, the specifier 202 specifies the pressure at the center of the overlap range as the pressure within the processing container 101 during plasma cleaning.

The acceptor 201 determines whether it was possible for the specifier 202 to specify the pressure for plasma cleaning (S12). For example, when there is no overlap range between the first pressure range and the second pressure range, it is determined that it is impossible to specify the pressure for plasma cleaning. When it is impossible to specify the pressure for plasma cleaning (S12: "No"), the acceptor 201 displays, on the user interface 210, a message that there is no pressure that satisfies the conditions for plasma cleaning (S13) and terminates the processing.

On the other hand, when it was possible to specify the pressure for plasma cleaning (S12: "Yes"), the specifier 202 stores the specified pressure within the processing chamber 101 during plasma cleaning in the cleaning setting data 223 as the set pressure for plasma cleaning (S14) and terminates the processing.

Figure 12:
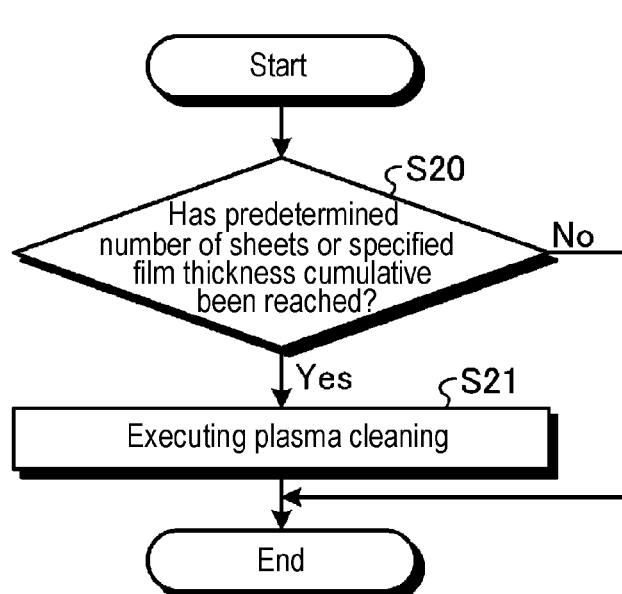
FIG. 12 is a flowchart illustrating an example of a flow of a cleaning process according to an embodiment.

Next, a flow of a plasma cleaning will be described. FIG. 12 is a flowchart illustrating an example of a flow of a cleaning process according to an embodiment. The cleaning process of FIG. 12 is executed at a time when plasma cleaning is executed periodically, such as each time film formation is performed on a predetermined number of substrates W or each time film formation is performed to a predetermined cumulative film thickness.

The cleaning controller 203 determines whether it is time to execute plasma cleaning, such as each time film formation is performed on a predetermined number of substrates W or each time film formation is performed to a predetermined cumulative film thickness (S20). When it is time to execute plasma cleaning (S20: "Yes"), the cleaning controller 203 executes plasma cleaning within the processing container 101 by adjusting the pressure within the processing container 101 to the pressure specified by the specifier 202 while supplying a cleaning gas into the processing container 101, and generating plasma in the processing container 101 by microwaves (S21) and terminates the processing. For example, the cleaning controller 203 reads a set pressure for plasma cleaning from the cleaning setting data 223. The cleaning controller 203 controls the exhaust mechanism 104 to adjust the pressure within the processing container 101 to the set pressure for plasma cleaning. The cleaning controller 203 also controls the gas supplier 127 to supply the cleaning gas from the gas supplier 127 into the processing container 101. In addition, the cleaning controller 203 controls the microwave plasma source 105 to radiate microwaves from the microwave plasma source 105 into the processing container 101. As a result, plasma of the cleaning gas is generated in the processing container 101, and plasma cleaning is executed. If it is not time to execute plasma cleaning (S20: "No"), processing is terminated and film formation is continued.

The cleaning time for plasma cleaning may be set in advance. In addition, an optical sensor may be provided in the plasma processing apparatus 100, the cleaning controller 203 may detect the emission of plasma with the optical sensor, and plasma cleaning may be executed before detecting the saturation of emission intensity of plasma. The optical sensor may be disposed within the processing container 101 to detect the emission of plasma. Alternatively, the optical sensor may be disposed outside the processing container 101 and detect emission of plasma through a transparent window provided in the processing container 101.

As a result, with the plasma processing apparatus 100 according to the present embodiment, it is possible to suppress damage to the interior of the processing container 101 due to plasma cleaning and to improve productivity.

In the above-described embodiment, the case where one pressure within the overlap range is specified by the specifier 202 and the pressure within the processing container 101 is adjusted to the specified one pressure in each plasma cleaning has been described by way of an example. However, the present disclosure is not limited thereto. In each plasma cleaning, the pressure within the processing container 101 may be varied within the overlap range. The specifier 202 may specify a higher pressure within the processing container 101 during plasma cleaning depending on an increase in the number of times the plasma cleaning has been executed. For example, the pressure within the processing chamber 101 during plasma cleaning is increased gradually or stepwise depending on an increase in the number of times plasma cleaning has been executed. The protective film 101a in the initial state has no damage. Therefore, the cleaning time can be shortened by setting the pressure within the processing container 101 during plasma cleaning to a low pressure within the overlap range. Moreover, damage is accumulated in the protective film 101a each time plasma cleaning is executed. Therefore, by increasing the pressure within the processing chamber 101 during plasma cleaning gradually or stepwise within the overlap range depending on an increase in the number of times the plasma cleaning has been performed, it is possible to suppress the increase in damage accumulated in the protective film 101a so that generation of particles can be suppressed.

In addition, the cleaning controller 203 may monitor the amount of cleaning during plasma cleaning and may control the plasma cleaning depending on the amount of cleaning. For example, the cleaning controller 203 detects the emission of plasma with an optical sensor and monitors the amount of cleaning from the emission intensity of plasma. Based on the change in the amount of cleaning, the cleaning controller 203 may control the power of the microwave plasma, the power ratio of the microwave plasma, the flow rate of the cleaning gas, and the flow rate ratio of the cleaning gas while maintaining the pressure within the processing container 101 at the specified pressure.

In addition, in the above-described embodiment, the case where the overlap range is specified by using the first relation data 221 and the second relation data 222 and the pressure within the processing container 101 during plasma cleaning is specified from the overlap range has been described by way of an example. However, the present disclosure is not limited thereto. For example, through calculation or the like from the amount of damage and the cleaning rate, which are conditions for plasma cleaning, the specifier 202 may specify the range of pressure of the processing container 101 in which plasma cleaning can be executed at a level equal to or lower than the amount of damage and at a level equal to or higher than the cleaning rate. In addition, for example, for each amount of damage and each cleaning rate, data that stores the range of pressure of the processing container 101 in which plasma cleaning can be executed at a level equal to or lower than the amount of damage and at a level equal to or higher than the cleaning rate is stored in the storage 220. With reference to the data stored in the storage 220, the specifier 202 may specify the pressure range corresponding to the amount of damage and the cleaning rate, which are the conditions of plasma cleaning, and may specify the pressure within the processing container during the plasma cleaning from the specified pressure range.

As described above, the cleaning method according to the embodiment includes a specifying process (S11) and the cleaning process (S20). In the specifying process, the pressure within the processing container 101 during plasma cleaning is specified from the amount of damage to a protective film 101a provided on the inner surface of the processing container 101 and the cleaning rate at which deposits deposited in the processing container 101 are removed, wherein the amount of damage and the cleaning rate are conditions for plasma cleaning. In the cleaning process, the pressure within the processing container 101 is adjusted to a pressure specified in the specifying process while supplying a cleaning gas into the processing container

101, plasma is generated in the processing container 101 by microwaves, and the interior of the processing container 101 is cleaned with the plasma. As a result, with the cleaning method according to the embodiment, it is possible to suppress damage to the interior of the processing container 101 due to plasma cleaning and to improve productivity.

In addition, in the specifying process, from the first relation data 221 indicating the relationship between the pressure within the processing container 101 and the amount of damage to the protective film 101a in plasma cleaning, a first pressure range in which an amount of damage equal to or less than the amount of damage as a condition for plasma cleaning is obtained. In the specifying step, from the second relation data 222 indicating the relationship between the pressure within the processing container 101 and the cleaning rate in plasma cleaning, a second pressure range in which a cleaning rate equal to or higher than the cleaning rate as a condition for plasma cleaning is obtained. In the specifying step, from the overlap range where the specified first pressure range and second pressure range overlap each other, the pressure within the processing chamber 101 during plasma cleaning is specified. As a result, with the cleaning method according to the embodiment, it is possible to specify the pressure in the processing container 101 during plasma cleaning that satisfies the amount of damage and the cleaning rate, which are conditions for plasma cleaning.

In addition, in the specifying step, the pressure in the processing container 101 is specified to be from the range of 30 Pa to 60 Pa. As a result, with the cleaning method according to the embodiment, it is possible to suppress damage to the protective film 101a due to plasma cleaning compared with the plasma cleaning of the comparative example.

In addition, the cleaning gas contains a halogen-based gas. In addition, the cleaning gas contains any of $NF_3$, $ClF_3$, $SF_6$, and $CF_4$. As a result, with the cleaning methods according to the embodiment, it is possible to remove silicon-containing deposits, such as SiN.

In addition, the cleaning gas contains an inert gas. The inert gas includes at least one of $N_2$, Ar, and He. The flow rate ratio between the cleaning gas and the inert gas is 10:1 to 10:15. As a result, with the cleaning method according to the embodiment, it is possible to stably generate plasma even in a high-vacuum state having a relatively low pressure.

In addition, the processing container 101 includes a plurality of microwave radiation mechanisms 143 in the central portion of the upper portion and in the peripheral portion surrounding the central portion, and the power ratio of microwave plasma radiated from the microwave radiation mechanisms 143 between the central portion and the peripheral portion is adapted to be controllable. The plurality of microwave radiation mechanisms 143 are capable of controlling the power ratio of microwave plasma between the central portion and the peripheral portion to be within a range of 0:550 to 500:550. As a result, with the cleaning method according to the embodiment, it is possible to change the states of plasma between the central portion and the peripheral portion.

In addition, the cleaning gas contains a halogen-based gas and an inert gas. The processing container 101 includes gas introduction holes (the gas introduction nozzles 123 and 124) in the upper portion and the side wall portion, the halogen-based gas is supplied from the gas introduction holes in the upper portion, and the inert gas is introduced from the gas introduction holes in the upper portion and/or the side wall portions. As a result, with the cleaning method according to the embodiment, it is possible to change a region to be cleaned.

In addition, the plasma processing apparatus 100 according to an embodiment includes a processing container 101, a gas supplier (the gas supply mechanism 103), an adjustor (the exhaust mechanism 104), and a radiator (the microwave plasma source 105), a specifier 202, and a cleaning controller 203. The processing container 101 is provided with a protective film 101a on its inner surface. The gas supplier supplies a cleaning gas into the processing container 101. The adjustor adjusts the pressure within the processing container 101. The radiator radiates microwaves for plasma generation into the processing container 101. The specifier 202 specifies the pressure within the processing container 101 during plasma cleaning from the amount of damage to the protective film 101a and the cleaning rate for removing deposits deposited in the processing container 101, wherein the amount of damage and the cleaning rate are conditions for plasma cleaning. The cleaning controller 203 controls the adjuster to adjust the pressure within the processing container 101 to the pressure specified by the specifier 202 while controlling the gas supplier to supply the cleaning gas into the processing container 101, and controls the radiator to radiate microwaves to generate plasma within the processing container 101, so that the interior of the processing container 101 is cleaned with the plasma. As a result, with the plasma processing apparatus 100 according to the embodiment, it is possible to specify the pressure within the processing container 101 during plasma that satisfies the amount of damage and the cleaning rate, which are conditions for plasma cleaning.

Although embodiments have been described above, it should be considered that the embodiments disclosed herein are exemplary in all respects and are not restrictive. Indeed, the embodiments described above can be implemented in various forms. In addition, the above-described embodiments may be omitted, replaced, or modified in various forms without departing from the scope and spirit of the claims.

For example, in the above-described embodiments, although the case where the substrate W is a semiconductor wafer has been described as an example, the present disclosure is not limited thereto. Any other substrate may be used as the substrate W.

It should be understood that the embodiments disclosed herein are examples in all respects and are not restrictive. Indeed, the above-described embodiments can be implemented in various forms. The above-described embodiments may be omitted, replaced, or modified in various forms without departing from the scope and spirit of the appended claims.

EXPLANATION OF REFERENCE NUMERALS

100: plasma processing apparatus, 101: processing container, 101a: protective film, 102: stage, 103: gas supply mechanism, 104: exhaust mechanism, 105: microwave plasma source, 123, 124: gas introduction nozzle, 125, 126: gas supply pipe, 127: gas supplier, 130: microwave output part, 140: antenna unit, 142: amplifier, 143: microwave radiation mechanism, 200: controller, 201: acceptor, 202: specifier, 203: cleaning controller, 210: user interface, 220: storage, 221: first relation data, 222: second relation data, 223: cleaning setting data, W: substrate

18

What is claimed is:

1. A cleaning method comprising:
specifying a pressure within a processing container during plasma cleaning from an amount of damage to a protective film provided on an inner surface of the processing container and a cleaning rate at which a deposit deposited in the processing container is removed, wherein the amount of damage and the cleaning rate are conditions for plasma cleaning; and
cleaning an interior of the processing container with plasma by adjusting the pressure within the processing container to the pressure specified in the specifying while supplying a cleaning gas into the processing container and generating plasma within the processing container by microwaves,
wherein the specifying the pressure includes:
from first relational data indicating a relationship between the pressure within the processing container and the amount of damage to the protective film in plasma cleaning, specifying a first pressure range in which the amount of damage is equal to or less than the amount of damage that is the condition for the plasma cleaning;
from second relationship data indicating a relationship between the pressure within the processing container and the cleaning rate in the plasma cleaning, specifying a second pressure range in which a cleaning rate is equal to or higher than the cleaning rate that is the condition for the plasma cleaning; and
from an overlap range where the specified first pressure range and the specified second pressure range overlap each other, specifying the pressure within the processing container during the plasma cleaning.

2. The cleaning method of claim 1, wherein a film formation on a substrate is executed within the processing container,
wherein the cleaning the interior of the processing container is executed each time the film formation is performed on a predetermined number of substrates or each time the film formation is performed to a predetermined cumulative film thickness, and
wherein in the specifying the pressure, the pressure within the processing container during the plasma cleaning is specified to be higher as a number of times the cleaning has been performed is increased.

3. The cleaning method of claim 1, wherein the cleaning gas includes a halogen-based gas.

4. The cleaning method of claim 1, wherein the cleaning gas includes any one of $NF_3$, $ClF_3$, $SF_6$, and $CF_4$.

5. The cleaning method of claim 1, wherein, in the specifying the pressure, the pressure within the processing container is specified to be within a range of 30 Pa to 60 Pa.

6. The cleaning method of claim 5, wherein a film formation on a substrate is executed within the processing container,
wherein the cleaning the interior of the processing container is executed each time the film formation is performed on a predetermined number of substrates or each time the film formation is performed to a predetermined cumulative film thickness, and
wherein in the specifying the pressure, the pressure within the processing container during the plasma cleaning is specified to be higher as a number of times the cleaning has been performed is increased.

7. The cleaning method of claim 6, wherein the cleaning gas includes a halogen-based gas.

8. The cleaning method of claim 7, wherein the cleaning gas includes any one of $NF_3$, $ClF_3$, $SF_6$, and $CF_4$.

9. The cleaning method of claim 8, wherein the cleaning gas includes an inert gas, and wherein the inert gas comprises at least one of $N_2$, Ar, and He.

10. The cleaning method of claim 9, wherein a flow rate ratio between the cleaning gas and the inert gas is 10:1 to 10:15.

11. The cleaning method of claim 10, wherein the processing container includes a plurality of microwave radiation mechanisms in a central portion of an upper portion of the processing container and in a peripheral portion surrounding the central portion, and a power ratio of microwave plasma radiated from the microwave radiation mechanisms between the central portion and the peripheral portion is controllable.

12. The cleaning method of claim 11, wherein the plurality of microwave radiation mechanisms is configured to control the power ratio of microwave plasma between the central portion and the peripheral portion to be in a range of 0:550 to 500:550.

13. The cleaning method of claim 12, wherein the cleaning gas includes the halogen-based gas and the inert gas, wherein the processing container includes gas introduction holes in the upper portion of the processing container and in a side wall portion of the processing container, wherein the halogen-based gas is supplied from the gas introduction hole in the upper portion, and wherein the inert gas is supplied from at least one of the gas introduction hole in the upper portion and the gas introduction hole in the side wall portion.

14. The cleaning method of claim 13, wherein, in the cleaning the interior of the processing container, a cleaning amount during the plasma cleaning is monitored by a cleaning amount monitor, and based on a change in the cleaning amount, a power of microwave plasma, a power ratio of microwave plasma, a flow rate of the cleaning gas, and a flow rate ratio of the cleaning gas are controlled while the pressure within the processing container is maintained at the pressure specified in the specifying the pressure.

15. The cleaning method of claim 14, wherein the deposit is a silicon-containing material deposited within the processing container by forming a film of the silicon-containing material on a substrate within the processing container.

16. The cleaning method of claim 15, wherein the silicon-containing material is SiN, SiCN, SION, SiOCN, SiC, or amorphous silicon.

17. The cleaning method of claim 16, wherein the protective film is an $Y_2O_3$ film.

18. A processing apparatus comprising:

a processing container having a protective film provided on an inner surface of the processing container;

a gas supplier configured to supply a cleaning gas into the processing container;

an adjuster configured to adjust a pressure within the processing container;

a radiator configured to radiate microwaves for plasma generation into the processing container;

a specifier configured to specify the pressure within the processing container during plasma cleaning from an amount of damage to the protective film and a cleaning rate for removing a deposit deposited within the processing container, wherein the amount of damage and the cleaning rate are conditions for the plasma cleaning; and a cleaning controller configured to control the adjuster to adjust the pressure within the processing container to the pressure specified by the specifier while controlling the gas supplier to supply the cleaning gas into the processing container, and to control the radiator to radiate microwaves to generate plasma within the processing container, so that the interior of the processing container is cleaned with the plasma, wherein the specifier is configured to specify the pressure within the processing container by performing:

from first relational data indicating a relationship between the pressure within the processing container and the amount of damage to the protective film in plasma cleaning, specifying a first pressure range in which the amount of damage is equal to or less than the amount of damage that is the condition for the plasma cleaning;

from second relationship data indicating a relationship between the pressure within the processing container and the cleaning rate in the plasma cleaning, specifying a second pressure range in which a cleaning rate is equal to or higher than the cleaning rate that is the condition for the plasma cleaning; and from an overlap range where the specified first pressure range and the specified second pressure range overlap each other, specifying the pressure within the processing container during the plasma cleaning.

\* \* \* \* \*